(12) United States Patent
Val et al.

(10) Patent No.: US 10,483,180 B2
(45) Date of Patent: Nov. 19, 2019

(54) PROCESS FOR THE WAFER-SCALE FABRICATION OF HERMETIC ELECTRONIC MODULES

(71) Applicant: PACKAGING SIP, Saint-Rémy-lès-Chevreuse (FR)

(72) Inventors: Christian Val, Saint-Rémy-lès-Chevreuse (FR); Alexandre Val, Le Chesnay (FR)

(73) Assignee: PACKAGING SIP, Saint-Rémy-lès-Chevreuse (FR)

( * ) Notice: Subject to any disclaimer, the term of this patent is extended or adjusted under 35 U.S.C. 154(b) by 0 days.

(21) Appl. No.: 15/829,699

(22) Filed: Dec. 1, 2017

(65) Prior Publication Data

US 2018/0182683 A1    Jun. 28, 2018

(30) Foreign Application Priority Data

Dec. 27, 2016 (FR) ..................................... 16 63418

(51) Int. Cl.
*H01L 23/31* (2006.01)
*H01L 23/552* (2006.01)
*H01L 23/498* (2006.01)

(52) U.S. Cl.
CPC ...... *H01L 23/3135* (2013.01); *H01L 23/3128* (2013.01); *H01L 23/49894* (2013.01); *H01L 23/552* (2013.01); *H01L 23/49816* (2013.01); *H01L 23/49827* (2013.01)

(58) Field of Classification Search
None
See application file for complete search history.

(56) References Cited

U.S. PATENT DOCUMENTS

| 5,355,016 | A | | 10/1994 | Swirbel et al. | |
|---|---|---|---|---|---|
| 5,461,545 | A | * | 10/1995 | Leroy | H05K 3/284 174/17.05 |
| 5,686,360 | A | * | 11/1997 | Harvey, III | H01L 51/0097 438/126 |
| 5,744,752 | A | * | 4/1998 | McHerron | H01L 23/10 174/521 |
| 5,760,466 | A | * | 6/1998 | Masuri | H01L 23/49531 257/633 |
| 6,150,187 | A | * | 11/2000 | Zyung | H01L 51/5253 438/126 |
| 6,172,371 | B1 | * | 1/2001 | DeJule | G01T 1/2002 250/361 R |

(Continued)

FOREIGN PATENT DOCUMENTS

| FR | 2 666 190 A1 | 2/1992 |
|---|---|---|
| FR | 2 726 151 A1 | 4/1996 |
| FR | 2 832 136 A1 | 5/2003 |

*Primary Examiner* — Xanthia C Cunningham
(74) *Attorney, Agent, or Firm* — Baker & Hostetler LLP

(57) ABSTRACT

An electronic module including one or more electronic components that are electrically connected to a multilayer PCB circuit comprises, on one face, electrical connection balls for the external electrical connection of the electronic module. The PCB circuit comprises a hermetically protective electrically insulating inorganic inner layer, and the module comprises six faces with an electrically insulating or conductive inorganic hermetic protection layer on the five faces other than that formed by the PCB circuit.

6 Claims, 5 Drawing Sheets

(56) References Cited

U.S. PATENT DOCUMENTS

| | | | |
|---|---|---|---|
| 6,351,027 B1* | 2/2002 | Giboney | H01L 21/50 257/432 |
| 6,548,912 B1 | 4/2003 | Graff et al. | |
| 7,347,826 B1* | 3/2008 | Karicherla | A61B 5/0215 600/372 |
| 7,807,506 B2* | 10/2010 | Beer | B81C 1/00269 257/678 |
| 7,972,884 B2* | 7/2011 | Obata | B81B 3/0078 257/E29.323 |
| 8,896,135 B2* | 11/2014 | Wang | C08F 8/42 257/788 |
| 9,490,449 B2* | 11/2016 | Choi | H01L 51/5253 |
| 9,704,770 B2* | 7/2017 | Suemori | H05K 1/186 |
| 10,153,321 B2* | 12/2018 | Verbakel | H01L 27/14618 |
| 2002/0015818 A1* | 2/2002 | Takahashi | H01L 23/26 428/76 |
| 2002/0090531 A1* | 7/2002 | Ueno | H01L 23/26 428/690 |
| 2003/0151479 A1* | 8/2003 | Stafford | B81B 7/0077 335/78 |
| 2003/0184222 A1* | 10/2003 | Nilsson | H05B 33/04 313/512 |
| 2004/0028849 A1* | 2/2004 | Stark | B81C 1/00333 428/34.1 |
| 2005/0051892 A1* | 3/2005 | Andoh | H01J 9/261 257/724 |
| 2006/0061272 A1* | 3/2006 | McCormick | H01L 51/5253 313/512 |
| 2007/0029562 A1* | 2/2007 | Koizumi | B81B 7/0041 257/98 |
| 2008/0149924 A1* | 6/2008 | Aitken | C03C 3/12 257/40 |
| 2008/0169758 A1* | 7/2008 | Cok | H01L 51/5262 313/506 |
| 2009/0065705 A1* | 3/2009 | Fuchs | G21K 4/00 250/370.11 |
| 2009/0205978 A1* | 8/2009 | Ju | G01N 27/041 205/791 |
| 2009/0291200 A1* | 11/2009 | Bedinger | H01L 23/3192 427/96.2 |
| 2010/0213621 A1 | 8/2010 | Sun et al. | |
| 2011/0039050 A1* | 2/2011 | Hogg | A61N 1/375 428/76 |
| 2012/0028011 A1* | 2/2012 | An | C03C 8/08 428/213 |
| 2013/0087379 A1* | 4/2013 | Grama | H03H 9/1014 174/546 |
| 2013/0094176 A1* | 4/2013 | Deeman | F21V 9/30 362/84 |
| 2013/0206230 A1* | 8/2013 | Sridharan | H01L 23/10 136/259 |
| 2013/0248828 A1 | 9/2013 | Schaepkens et al. | |
| 2013/0330498 A1* | 12/2013 | Hogg | A61N 1/375 428/76 |
| 2014/0017437 A1* | 1/2014 | Edwards | B32B 27/32 428/76 |
| 2014/0105547 A1* | 4/2014 | Baca | G02B 6/36 385/78 |
| 2014/0327150 A1 | 11/2014 | Jung et al. | |
| 2016/0311720 A1* | 10/2016 | Suffner | C03C 8/14 |
| 2017/0331070 A1* | 11/2017 | Mieda | B01J 20/22 |
| 2018/0337651 A1* | 11/2018 | Lee | H03H 3/08 |

\* cited by examiner

PROCESS FOR THE WAFER-SCALE FABRICATION OF HERMETIC ELECTRONIC MODULES

CROSS-REFERENCE TO RELATED APPLICATIONS

This application claims priority to foreign French patent application No. FR 1663418, filed on Dec. 27, 2016, the disclosure of which is incorporated by reference in its entirety.

FIELD OF THE INVENTION

The field of the invention is that of the wafer-scale fabrication of hermetic electronic modules.

BACKGROUND

An electronic module comprises one or more electronic components that are associated with a multilayer PCB (printed circuit board) interconnect circuit, which itself includes pads that are intended to receive balls of solder for the external electrical connection of the electronic module.

These components may be integrated within the PCB by being placed on an internal layer of the PCB, this being known as a PCB with embedded die. They may also be encapsulated within an epoxy resin after having been bonded and wired to the multilayer PCB circuit on the face opposite that which includes the solder balls; this is known as a ball grid array package.

The electronic components may be active components such as chips and/or passive components such as capacitors, inductors, etc., and/or MEMS (microelectromechanical systems).

The electronic module obtained may be standalone or may itself be added along with other electronic modules to a printed circuit including electrically conductive pads and a step of remelting the balls of the PCB circuit of the module is carried out in order to connect these balls to the pads of the printed circuit.

FIG. 1 shows a cross section of a ball grid array (BGA) package 1 that is intended to be added to a printed circuit; only two balls 4 have been shown on the pads 3 of the PCB circuit 2. The electronic component 32, in this instance a chip, is attached to the PCB circuit 2 by means of an adhesive bond or a preform 35. The electrical interconnect between the chip and the PCB circuit is formed by wires 31 that are soldered to the pads 33 of the chip and the pads 34 of the PCB circuit. The chip 32 and its connections 31 are moulded within a resin 10.

It is known that the resin within which the electronic components are moulded is watertight but not airtight (hermetic), since no organic material is airtight. This means that moisture (gas) will diffuse into the interior thereof, with consequences that are well known to users of plastic packages the world over:

The penetration of moisture into the interior of the package before it is added to the surface of the printed circuit produces an internal vapour pressure inside this package during the step of remelting the balls, which takes place at a maximum temperature of 260° C. This phenomenon is illustrated in FIG. 2, in which it is possible to see a non-hermetic ball grid array package 1 (the component is not shown so as not to overload the figure) which, exposed to atmospheric air, receives gaseous $H_2O$ by diffusion P1. The resulting pressure P2 will increase over a few seconds from atmospheric pressure to around twice that (273+260/273=1.95 $Kg/cm^2$); this pressure produces internal stresses, the energy of which is dissipated by forming internal cracks in the package.

Since the penetration of water vapour takes place in the presence of acidic (Cl, $SO_4$, etc.) or basic (Na, K, etc.) ions, acids or bases are formed which may attack the metal portions of the chips and in particular the aluminium forming the interconnect pads, which is an amphoteric metal.

The international standardization body JEDEC has therefore determined multiple quality levels for these packages based solely on the criterion of moisture uptake before mounting on printed circuits. There are seven moisture sensitivity levels (MSL). Level 6 concerns the packages that are most sensitive to moisture: after a duration of six hours before mounting, such a package without protective packaging must be degassed again. Level 0 is the best (→the package may be stored for an indeterminate duration), but almost no plastic package achieve this level of performance.

Previous work has been carried out with the aim of overcoming the fact that organic materials are intrinsically non-hermetic. They are based on the deposition of a diffusion barrier made of a material that is non-organic and non-electrically conductive in order to avoid short circuits.

Any non-organic and non-electrically conductive material, such as oxides ($Al_2O_3$, etc.), nitrides ($Si_3N_4$, etc.), carbides, etc. can be used as long as they can be deposited at low temperature (lower than 100° C. for example) and are sufficiently deformable (ductile) so as not to crack after multiple thermal cycles. Silicon oxide ($SiO_2$), and more specifically a non-stoichiometric oxide such as $SiO_x$ where x is smaller than 2, may also be mentioned. This inorganic layer may be deposited by plasma-enhanced chemical vapour deposition (PE-CVD) but the temperatures can generally reach 200° C., which is too high for plastic packages. Most fortunately, a technique referred to as the atmospheric plasma technique makes it possible to carry out these deposition operations below 100° C., which is more acceptable for this type of package.

Multiple patents have been filed:
"Method and device for hermetic encapsulation of electronic components" filed on 24 Aug. 1990 under No: 90 10631.
"Method and device for hermetic protection of electronic circuit" filed on 25 Oct. 1994.
"Device for the hermetic encapsulation of a component that must be protected against all stresses" filed on Sep. 11, 2001 under No: 01 14543.

As shown in FIG. 3, certain BGA package manufacturers use a protective metal deposit 5 on five faces of the electronic module. Of course, the sixth face with the connection balls 4 does not receive this deposit in order to avoid short-circuiting the connection balls. The package, having received this type of metal, hence inorganic, protection, is hermetic on its five protected faces but not on the sixth; moisture therefore penetrates via the sixth face (the PCB face), which is not protected as illustrated in FIG. 4a. The diffusion P1 of gaseous $H_2O$ is slower by virtue of the protection and the internal pressure P3 takes longer to be reached but the effects of the penetration of $H_2O$ into the module are more significant at the level of the PCB since the pressure P3 is exerted primarily on this sixth face, which then exhibits a leakage rate that is substantially higher than the five other faces. FIG. 4b shows a view of the possible deformation 6 (shown in dashed lines) of the PCB face with the connection balls 4.

One solution for ensuring the hermeticity of ball grid array packages is to deposit a hermetic layer on the six faces of the package. Protecting the sixth face is much more difficult since it contains the external connections: balls, pads, etc. (QFN packages). This solution consists in depositing a hermetic layer on this sixth face while avoiding the balls during the deposition of this insulating layer. This is not easy for the following reasons:

A) A mask or a local stripping operation is required.
B) In the case of the mask, there is a risk that the thin inorganic layer surrounding the ball does not form a perfect seal with the ball, especially after the remelting thereof when soldering. A gap may exist and negatively effect the hermeticity of the assembly.
C) The equipment needed for this additional deposition operation in order to make the package hermetic, such as a plasma torch, is not generally used by manufacturers of electronic modules on their automated protection production lines.

SUMMARY OF THE INVENTION

The aim of this patent application is to overcome the problem presented by the non-hermeticity of this sixth face.

This problem has been presented by considering an electronic module including an electronic component added to a PCB, but of course the problem of hermeticity is also encountered for an electronic module including a PCB with embedded die.

The solution consists in making all six faces of the electronic module hermetic, including the face intended for external connection, by modifying the PCB. A hermetically protective inorganic layer is deposited inside the multilayer PCB during the fabrication thereof: the "hermetic" level is inserted inside the multilayer so as to form a barrier against the diffusion of moisture into the interior of the PCB. This level is preferably inserted as close as possible to the external connection level so as to protect the greatest number of layers of the PCB from moisture.

The protection of the five other faces is achieved by:

depositing a metal layer in the case of electrical, magnetic, etc. shielding; or depositing an electrically insulating layer with, for example, SiOx or any other oxide ($Al_2O_3$, etc.), nitride ($Si_3N_4$, etc.), or carbide, etc.

More specifically, the subject of the invention is an electronic module including one or more electronic components that are electrically connected to a multilayer PCB circuit that comprises, on one face, electrical connection balls for the external electrical connection of the electronic module. It is mainly characterized in that the PCB circuit comprises a hermetically protective electrically insulating inorganic inner layer, and in that the module comprises six faces with an electrically insulating or conductive inorganic hermetic protection layer entirely covering the five faces other than that formed by the PCB circuit.

The one or more electronic components are for example encapsulated on one face of the PCB opposite the face with the connection balls. They may be distributed over multiple levels in order to form a stack on the PCB and thus to obtain a 3D electronic module.

The PCB may itself include one or more electronic components that are incorporated within the PCB.

The electronic components are active components and/or passive components and/or MEMS.

BRIEF DESCRIPTION OF THE DRAWINGS

Other features and advantages of the invention will become apparent on reading the detailed description that follows, given by way of non-limiting example and with reference to the appended drawings, in which:

FIG. 4a, described above, illustrates the penetration of moisture into the interior of a package such as shown in FIG. 3, and the internal pressure resulting therefrom, while

From one figure to another, the same elements bear the same references.

In the rest of the description, the expressions "upper", "lower", "front", "back" and "side" are used with reference to the orientation of the described figures. In so far as the module may be positioned according to other orientations, the directional terminology is indicated by way of illustration and is not limiting.

DETAILED DESCRIPTION

A PCB circuit consists of a multilayer that may have from two to 40 layers or levels. For electronic modules with components added to a PCB, this is commonly between four and eight levels; for PCBs with embedded die, the multilayer commonly includes from six to 40 levels.

Figure 1:
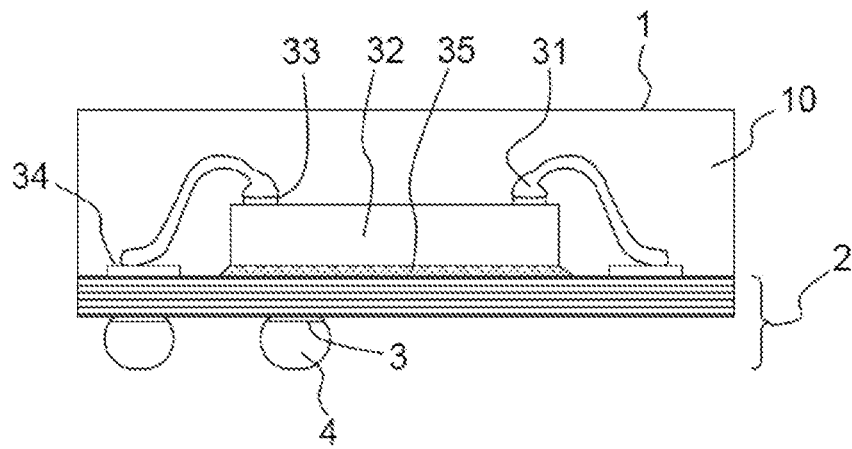
FIG. 1, described above, schematically shows an example of a ball grid array package according to the prior art, seen in cross section.
Figure 2:
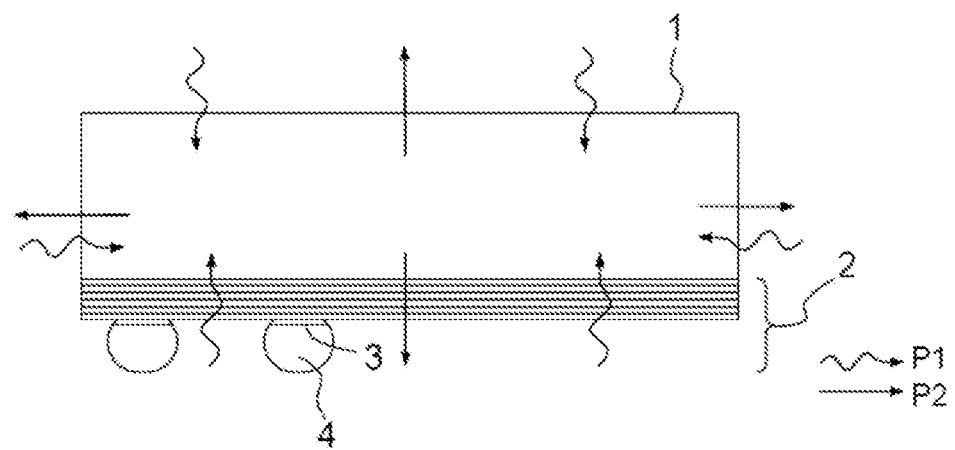
FIG. 2, described above, illustrates the penetration of moisture into the interior of a package seen in cross section, and the resulting internal pressure.
Figure 3:
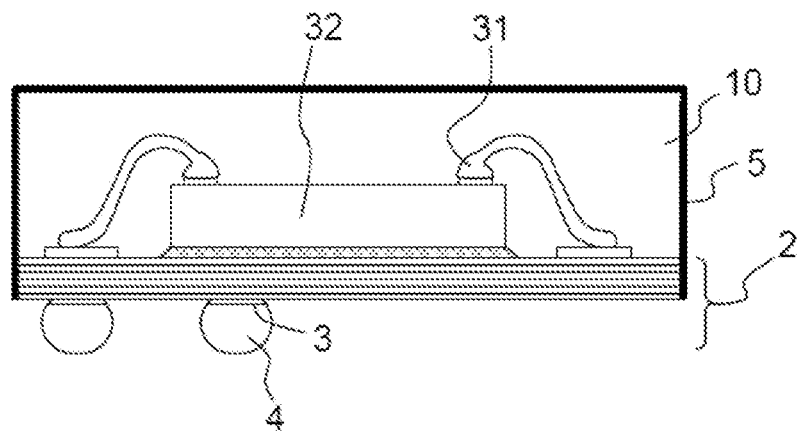
FIG. 3, described above, schematically shows an example of a ball grid array package that is hermetic on five faces according to the prior art, seen in cross section.
Figure 4A:
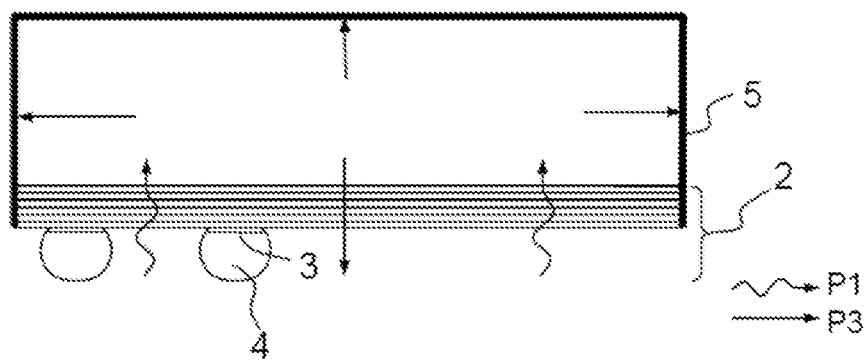
Figure 4B:
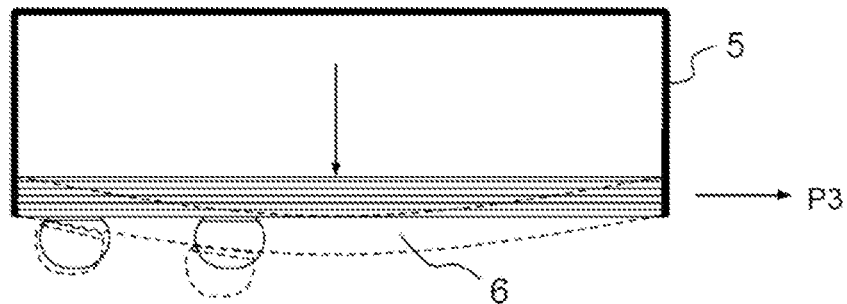
FIG. 4b illustrates the deformation caused by this internal pressure.
Figure 5:
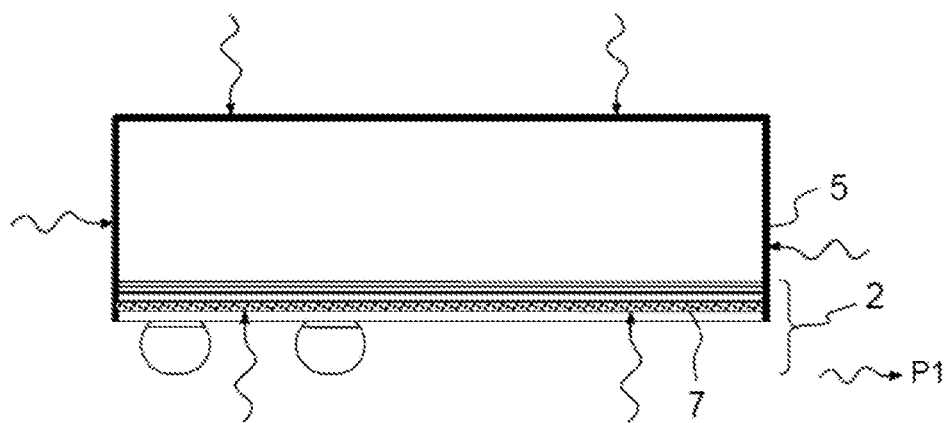
FIG. 5 schematically shows an example of a ball grid array package according to the invention, seen in cross section.

According to the invention and as shown in FIG. 5, a "hermetic" level 7 is inserted into the interior of the multilayer 2 and preferably as close as possible to the external connection level so as to prevent the diffusion of moisture into the interior of the PCB to the greatest possible extent. In order to produce this "hermetic" level on the wafer scale (in the context of a wafer scale fabrication of the hermetic electronic modules), the layer coated with the inorganic material may be produced in various ways:

Producing a thin (between a few µm and a few hundred µm thick) silica-filled epoxy resin panel, then depositing an inorganic coating such as SiOx comprised between 0.1 and 1 µm in thickness, over one face of the panel or over the two opposite faces (so as to cover them entirely, as shown in the figures), in view of the low cost of atmospheric plasma deposition when this technique is chosen; optionally, this panel thus made hermetic may then be coated with a layer of adhesive on both sides, especially when it is thin. An inert hermetic layer (or level) is thus obtained.

Using a silica-filled epoxy resin panel already including conductive elements on one or both of its faces, having a thickness that is typically comprised between 0.1 mm and 0.8 mm, and directly depositing a layer of inorganic material of SiOx (0.1 to 1 μm) on one or both faces, so as to cover them entirely, as shown in the figures.

The use of a coating of SiOx is described, but another coating may be used, such as any other oxide ($Al_2O_3$, etc.), nitride ($Si_3N_4$, etc.), or carbide, etc.

Figure 6:
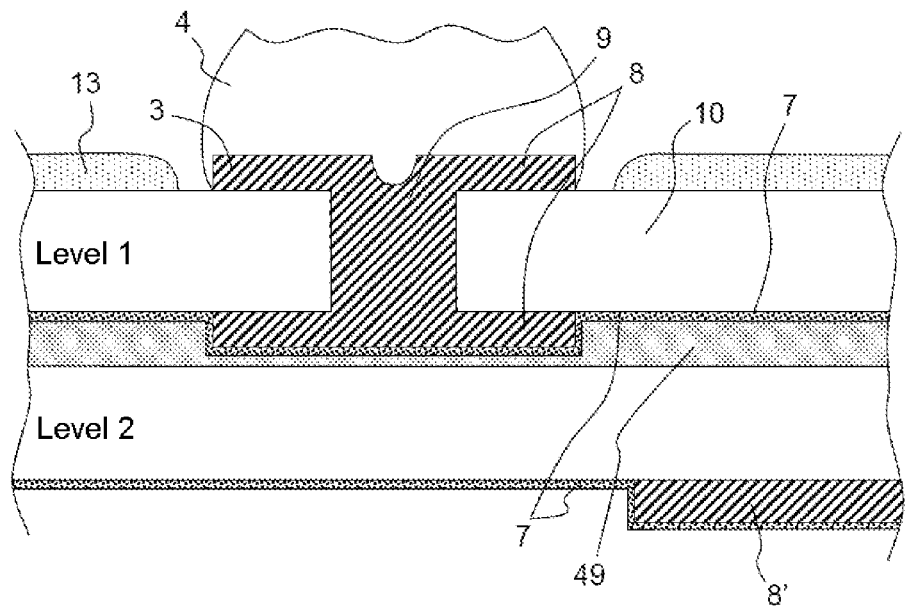
FIG. 6 schematically shows an enlarged view of an example of a portion of a PCB circuit of the ball grid array package of FIG. 5.

In the case of a multilayer PCB, the various layers of the PCB, including this hermetic layer 7, may be conventionally bonded by lamination as shown in FIG. 6, by means of an adhesive 49. In the first case (producing a panel), this means adding an inert level to the PCB, while in the second case (use of a panel including conductive elements), an existing non-inert level is used, on which this hermetic layer is deposited. This second approach is industrially advantageous and less expensive. In the example of FIG. 6, the inorganic layer 7 of SiOx is deposited over an entire face of the level 1 (which includes conductors 3 and 8 on both of its faces) before bonding the level 2 by means of an adhesive 49; in view of the low cost of the deposit, an inorganic layer 7 of SiOx is also deposited over a face of the level 2 on which it is possible to see a portion of the electrically conductive track 8'; this provides double the protection from the diffusion of gaseous $H_2O$ through the level 2.

Figure 7:
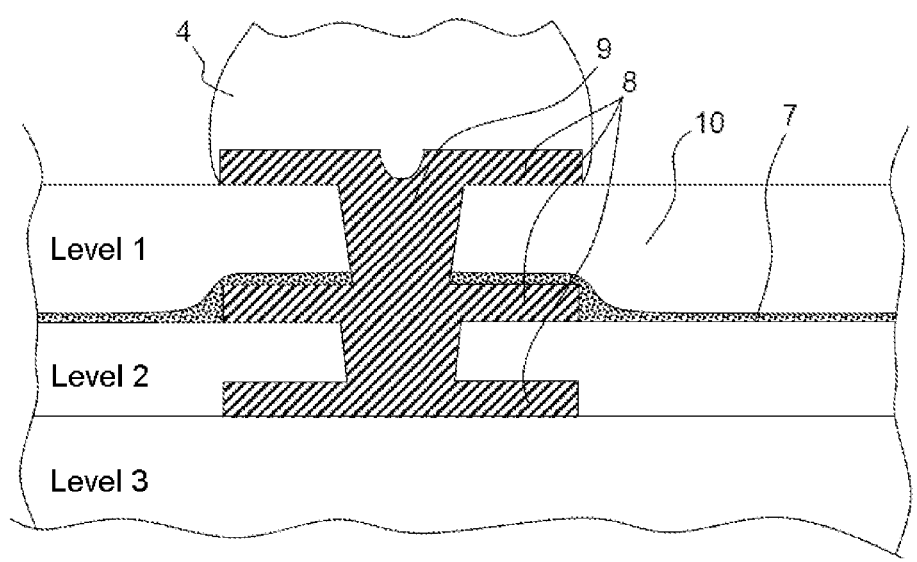
FIG. 7 schematically shows an enlarged view of another example of a portion of a PCB circuit of the ball grid array package of FIG. 5.

The various layers may also be formed one on top of the other as shown in FIG. 7, in a process referred to as a "build-up" process. Electrically conductive elements, such as pads 8 or tracks, are formed on each of the layers (or levels 1, 2, 3) in the usual manner. In the example of FIG. 7, the layers are formed from the level n, the last level to be formed being the level 1 that bears its pads 3 and its solder balls 4 for the external connections. These conductive elements 8, 3 are formed on a single face of each layer as shown in the figure, the resin 10 of the subsequent layer overmoulding these conductive elements (the resin of the layer 2 overmoulds the conductive elements 8 of the layer 3, the resin of the layer 1 overmoulds the conductive elements 8 of the layer 2). According to the invention, a hermetic layer 7 is deposited on the face of the level 2 bearing conductive elements 8 before the formation of the level 1. The inorganic deposit 7 is deposited over the entire surface of the level 2 and covers the pads 8 of this level 2, thereby making the latter hermetic.

As the layers are assembled (by bonding or by building them up, or by means of any other process) metallized vias 9 are produced that make it possible to connect certain electrically conductive elements 8, 3 through the organic dielectric portion 10 of one level with those of another level, as may be seen in FIG. 6, or else multiple levels as shown in the example of FIG. 7. The via passes through the organic dielectric portion 10 of one level and ends on the pad 8 or the track of the level to be reached.

Some of these levels, which are located in the middle of the multilayer and are referred to as "core PCB" levels, may contain conductive power supply planes.

There are two different techniques for producing these vias, in which they are either etched by means of a laser beam or mechanically drilled by means of diamond drill bits, for example. The vias etched by laser beam are generally slightly conical, as illustrated in FIG. 7, while they are cylindrical when they are drilled by a mechanical drill bit, as illustrated in FIG. 6.

The thin inorganic coating 7 may be locally destroyed when producing a via as shown in FIG. 7. However, the hermeticity does not risk being jeopardized since the metal of the vias 9 is hermetic.

After this step of producing the vias, their chemical and electrochemical metallization is carried out as usual.

Electronic components are bonded and wired to a PCB with a hermetic level such as described above, then moulded within resin. The encapsulated electronic components may be distributed over multiple levels in order to form a stack on the PCB and thus to obtain a 3D electronic module.

This assembly is then diced vertically (=along Z) in order to form individual BGA packages. The steps described up to now have advantageously been carried out on the wafer scale. Conventionally, electrical interconnect tracks are formed on the vertical faces of these packages: electronic modules are thus obtained.

Figure 8:
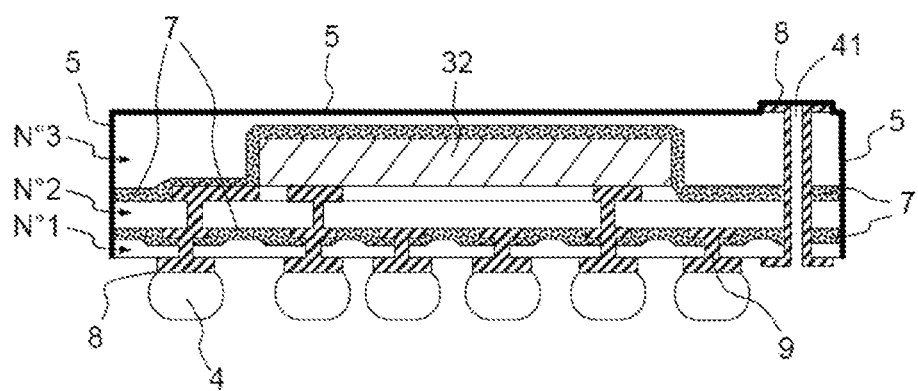
FIG. 8 schematically shows an example of a PCB circuit with embedded die according to the invention, seen in cross section.

In the case of a PCB with embedded die, the former is diced vertically in order to form electronic modules. FIG. 8 shows an example of a PCB with embedded die 32. It includes three layers (no 1, no 2, no 3), on the second layer of which a component 32 is placed. Two layers of inorganic coating 7 are formed, one between the layers 1 and 2, the other on the layer with the component. Metallized through-holes 41 are formed, which pass through the entire thickness of the PCB.

An electronic module may combine the two preceding cases, i.e. it includes a PCB with embedded die having a hermetic level and one or more bonded, wired and moulded components placed on the face opposite the face with external connections.

A conductive or electrically insulating hermetic inorganic coating layer 5 is deposited on the four vertical faces and the upper face (i.e. those without solder balls) of each module thus to obtain a hermetic electronic module. As may be seen in FIGS. 5 and 8, this hermetic layer entirely covers these five faces; there is no break in hermeticity between these five faces. This is illustrated in FIG. 5 for a ball grid array package that no longer takes up moisture by diffusion P1 and FIG. 8 for a PCB with embedded die. The hermeticity of the five faces is thus ensured. The module is also protected from the diffusion of moisture that may occur only via the sixth face by the hermetic level inserted into the PCB.

The invention claimed is:

1. An electronic module comprising:
   a multilayer PCB circuit that comprises:
      on one face, electrical connection balls for external electrical connection of the electronic module; and
      a hermetically protective electrically insulating inorganic inner layer;
   an electrically insulating or conductive inorganic hermetic protection layer;
   one or more electronic components that are electrically connected to the PCB circuit; and
   six faces with the electrically insulating or conductive inorganic hermetic protection layer entirely covering the five faces other than that formed by the PCB circuit, wherein
   the hermetically protective electrically insulating inorganic inner layer is in direct contact with the electrically insulating or conductive inorganic hermetic protection layer so as to form a continuous hermetical joint around the one or more electronic components.

2. The electronic module according to claim 1, wherein the one or more electronic components are encapsulated on one face of the PCB circuit opposite the face with the connection balls.

3. The electronic module according to claim 2, wherein the encapsulated electronic components are distributed over multiple levels in order to form a stack on the PCB circuit and thus to obtain a 3D electronic module.

4. The electronic module according to claim 1, wherein the PCB circuit includes one or more electronic components that are incorporated within the PCB circuit.

5. The electronic module according to claim 1, wherein the PCB circuit comprises another hermetically protective electrically insulating inorganic inner layer.

6. The electronic module according to claim 1, wherein the electronic components are active components and/or passive components and/or MEMS.

* * * * *